(12) United States Patent
Iwasaki et al.

(10) Patent No.: US 9,048,813 B2
(45) Date of Patent: Jun. 2, 2015

(54) ACOUSTIC WAVE DEVICE AND ANTENNA DUPLEXER USING THE SAME

(71) Applicant: Panasonic Corporation, Osaka (JP)

(72) Inventors: Tomohiro Iwasaki, Shiga (JP); Hiroyuki Nakamura, Osaka (JP); Tomoya Komatsu, Osaka (JP)

(73) Assignee: SKYWORKS PANASONIC FILTER SOLUTIONS JAPAN CO., LTD, Osaka (JP)

( * ) Notice: Subject to any disclaimer, the term of this patent is extended or adjusted under 35 U.S.C. 154(b) by 0 days.

(21) Appl. No.: 14/187,320

(22) Filed: Feb. 24, 2014

(65) Prior Publication Data

US 2014/0167881 A1    Jun. 19, 2014

Related U.S. Application Data

(63) Continuation-in-part of application No. PCT/JP2013/004546, filed on Jul. 26, 2013.

(30) Foreign Application Priority Data

Jul. 30, 2012   (JP) .................. 2012-167970

(51) Int. Cl.
  *H03H 9/25*    (2006.01)
  *H03H 3/10*    (2006.01)
  (Continued)

(52) U.S. Cl.
  CPC . *H03H 9/25* (2013.01); *H03H 3/10* (2013.01); *H03H 9/02102* (2013.01); *H03H 9/0222* (2013.01); *H03H 9/725* (2013.01)

(58) Field of Classification Search
  CPC ... H03H 9/0222; H03H 9/02102; H03H 9/25; H03H 9/725; H03H 3/10

USPC .......... 333/133, 193–196; 310/313 A, 313 B, 310/313 C, 313 R
  See application file for complete search history.

(56) References Cited

U.S. PATENT DOCUMENTS 7,573,178 B2 *  8/2009  Inoue et al. .............. 310/313 R
7,915,786 B2 *  3/2011  Matsuda et al. .......... 310/313 A
(Continued)

FOREIGN PATENT DOCUMENTS

JP    2013-145930    7/2013
WO    2005-034347    4/2005
(Continued)

OTHER PUBLICATIONS

International Search Report of PCT Application No. PCT/JP2013/004546 dated Sep. 10, 2013.

*Primary Examiner* — Patrick O'Neill
(74) *Attorney, Agent, or Firm* — Lando & Anastasi, LLP

(57) ABSTRACT

An acoustic wave device includes a piezoelectric substrate, a comb-shaped electrode formed on the piezoelectric substrate and configured to excite a Rayleigh wave as a main acoustic wave, a first dielectric film formed above the piezoelectric substrate to cover the comb-shaped electrode, and a second dielectric film having a portion provided between electrode fingers of the comb-shaped electrode and a portion provided above the comb-shaped electrode. The portion provided between the electrode fingers is provided between the piezoelectric substrate and the first dielectric film. The portion provided above the comb-shaped electrode is provided between the comb-shaped electrode and the first dielectric film. A speed of a transverse wave propagating through the first dielectric film is lower than a speed of the Rayleigh wave excited by the comb-shaped electrode. A speed of a transverse wave propagating through the second dielectric film is higher than the speed of Rayleigh wave excited by the comb-shaped electrode.

20 Claims, 8 Drawing Sheets

(51) Int. Cl.
   *H03H 9/02*  (2006.01)
   *H03H 9/72*   (2006.01)

(56) References Cited

U.S. PATENT DOCUMENTS

| | | | |
|---|---|---|---|
| 7,982,365 B2 * | 7/2011 | Goto et al. | 310/313 R |
| 8,427,032 B2 * | 4/2013 | Nishiyama et al. | 310/313 A |
| 8,791,774 B2 * | 7/2014 | Takata et al. | 333/133 |
| 2007/0096592 A1 | 5/2007 | Kadota et al. | |
| 2012/0104897 A1 * | 5/2012 | Nishiyama et al. | 310/313 C |
| 2013/0285504 A1 * | 10/2013 | Tamasaki | 310/313 C |

FOREIGN PATENT DOCUMENTS

| | | |
|---|---|---|
| WO | 2011-132443 | 10/2011 |
| WO | 2012-090698 | 7/2012 |

* cited by examiner

ACOUSTIC WAVE DEVICE AND ANTENNA DUPLEXER USING THE SAME

This application is a continuation-in-part of International Application PCT/JP2013/004546, filed on Jul. 26, 2013, the contents of which are incorporated herein by reference

TECHNICAL FIELD

The present disclosure relates to an acoustic wave device and an antenna duplexer using the acoustic wave device.

BACKGROUND ART

FIG. 10 is a schematic cross-sectional view of conventional acoustic wave device 101. Acoustic wave device 101 includes piezoelectric substrate 102, comb-shaped electrode 103 formed on piezoelectric substrate 102, and dielectric film 104 formed above substrate 102 for covering comb-shaped electrode 103. Comb-shaped electrode 103 is configured to exciting a Rayleigh wave having wavelength $\lambda$ as a main acoustic wave, Dielectric film 104 having a temperature coefficient of frequency (TCF) having a sign reverse to that of piezoelectric substrate 102 improves the TCF of acoustic wave device 101. A conventional acoustic wave device similar to acoustic wave device 101 is disclosed in, e.g. Patent Literature 1.

Conventional acoustic wave device 101 produces an extraneous acoustic wave, namely, a shear horizontal (SH) wave, having a frequency between a resonance frequency and an anti-resonance frequency of a Rayleigh wave. In the case that acoustic wave device 101 is used in a ladder filter or a double mode SAW (DMS) filter, the SH wave produces a ripple in pass bands of these filters and invites degradation in the characteristics thereof.

FIG. 11 shows admittance characteristics (dB) of acoustic wave device 101. In acoustic wave device 101, piezoelectric substrate 102 is made of a lithium niobate ($LiNbO_3$)-based substrate having a cut surface and a propagation direction of the Rayleigh wave expressed as an Euler angle ($\phi$, $\theta$, $\psi$), where $-10° \le \phi \le 10°$, $33° \le \theta \le 43°$, and $-10° \le \psi \le 10°$. Comb-shaped electrode 103 is made of a molybdenum (Mo) electrode having a film thickness of $0.05\lambda$, and excites a Rayleigh wave having wavelength $\lambda$ of 4000 nm as a main acoustic wave. Dielectric film 104 is made of silicon dioxide ($SiO_2$) having a film thickness of $0.25\lambda$ measured from the interface between substrate 102 and dielectric film 104 to an upper surface of dielectric film 104. As shown in FIG. 11, spurious emission 108 is produced by the SH wave as an extraneous acoustic wave between a resonance point and an anti-resonance point of the Rayleigh wave.

CITATION LIST

Patent Literature

Patent Literature 1: WO2005/034347

SUMMARY

An acoustic wave device includes a piezoelectric substrate, a comb-shaped electrode formed on the piezoelectric substrate and exiting a Rayleigh wave as a main acoustic wave, a first dielectric film formed above the piezoelectric substrate to cover the comb-shaped electrode, and a second dielectric film having a portion provided between electrode fingers of the comb-shaped electrode and a portion provided above the comb-shaped electrode. The portion of the second dielectric film provided between electrode fingers of the comb-shaped electrode is provided between the piezoelectric substrate and the first dielectric film. The portion of the second dielectric film provided above the comb-shaped electrode is provided between the comb-shaped electrode and the first dielectric film. A speed of a transverse wave propagating through the first dielectric film is lower than a speed of the Rayleigh wave excited by the comb-shaped electrode. A speed of a transverse wave propagating through the second dielectric film is higher than the speed of the Rayleigh wave excited by the comb-shaped electrode.

This structure prevents the frequency of the Rayleigh wave, a main acoustic wave, from increasing while relatively increasing the frequency of the SH wave, the extraneous acoustic wave. The frequency of the Rayleigh wave can be prevented from increasing since both of energies of the SH wave and the Rayleigh wave concentrate around an upper surface of the piezoelectric substrate; however, the larger energy of the Rayleigh wave is distributed in the first dielectric film than that of the SH wave.

As a result, in a filter using this acoustic wave device, the spurious emission caused by the SH wave is removed from the pass band of this filter, hence improving passing characteristics of the filter.

DETAIL DESCRIPTION OF PREFERRED EMBODIMENT

Figure 1:
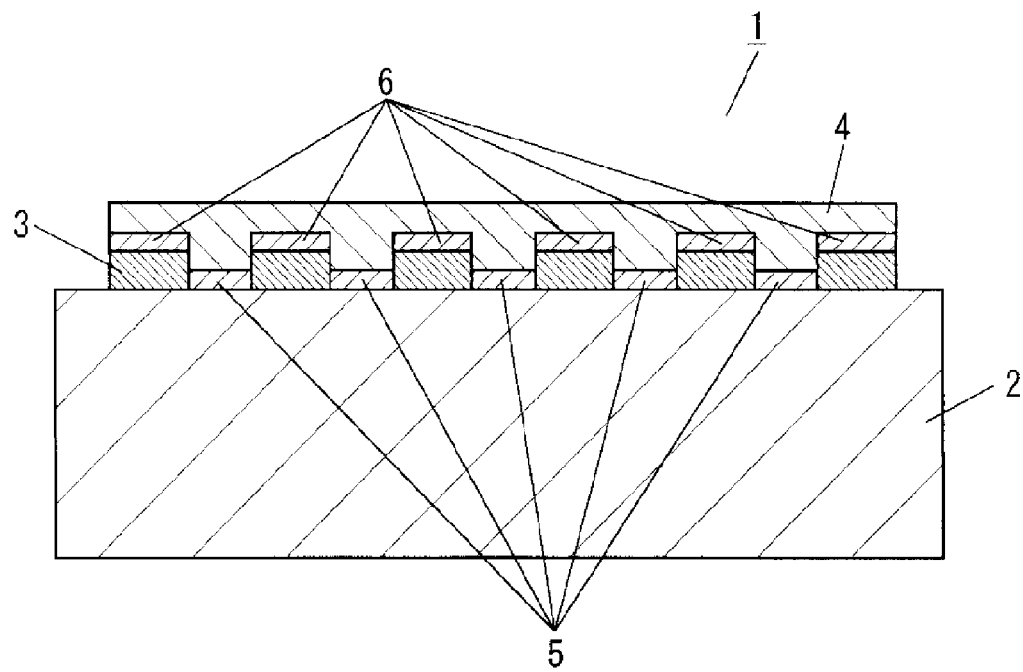
FIG. 1 is a schematic cross-sectional view of an acoustic wave device in accordance with an exemplary embodiment of the present invention.

FIG. 1 is a schematic cross-sectional view of an acoustic wave device in accordance with an exemplary embodiment of the present invention, and particularly, illustrates a cross section of the device along a direction perpendicular to a direction in which an interdigital transducer (IDT) electrode extends.

Acoustic wave device 1 shown in FIG. 1 includes piezoelectric substrate 2, comb-shaped electrode 3 formed on piezoelectric substrate 2 and exiting a Rayleigh wave as a main acoustic wave, first dielectric film 4 formed above piezoelectric substrate 2 to cover comb-shaped electrode 3. Acoustic wave device 1 further includes second dielectric film 5 provided between electrode fingers of the comb-shaped electrode and between piezoelectric substrate 2 and first dielectric film 4, and second dielectric film 6 provided above comb-shaped electrode 3 and between comb-shaped electrode 3 and first dielectric film 4. The Rayleigh wave has a wavelength $\lambda$ which is twice as long as pitches of the electrode fingers.

A speed of a transverse wave propagating through first dielectric film 4 is lower than a speed of the Rayleigh wave exited by comb-shaped electrode 3. A speed of a transverse wave propagating through second dielectric films 5 and 6 is higher than the speed of the Rayleigh wave excited by comb-shaped electrode 3.

A speed of a shear horizontal (SH) wave, an extraneous acoustic wave, excited by comb-shaped electrode 3 is higher than a speed of the transverse wave propagating through first dielectric film 4, and is lower than a speed of the transverse wave propagating through second dielectric films 5 and 6.

In the case that second dielectric films 5 and 6 are not provided, the SH wave, i.e. the extraneous acoustic wave, is produced between the resonance frequency and the anti-resonance frequency of the main acoustic wave, the Rayleigh wave. Acoustic wave device 1 prevents the frequency of the Rayleigh wave from increasing while causing the frequency of SH wave, the extraneous acoustic wave, to relatively increase. The frequency of the Rayleigh wave is prevented from increasing since both of energies of the SH wave and the Rayleigh wave concentrate around an upper surface of piezoelectric substrate 2 while a larger energy of the Rayleigh wave is distributed in first dielectric film 4 than that of the SH wave.

As a result, acoustic wave device 1 upon being used in a filter removes the spurious emission caused by the SH wave from the pass band of the filter, thus improving passing characteristics of the filter.

Piezoelectric substrate 2 is made of a piezoelectric single-crystal substrate that excites the Rayleigh wave as a main acoustic wave. For instance, piezoelectric substrate 2 is made of a lithium niobate (LiNbO$_3$)-based substrate having a cut angle and a propagation direction of the Rayleigh wave expressed as an Euler angle ($\phi$, $\theta$, $\psi$) where $-10°\leq\phi\leq10°$, $33°\leq\theta\leq43°$, and $-10°\leq\psi\leq10°$. Piezoelectric substrate 2 may be a piezoelectric medium substrate or a piezoelectric thin medium film made of, e.g. a quartz substrate or a lithium tantalite (LiTaO$_3$)-based substrate, or a kalium niobate-based substrate, or piezoelectric single-crystal medium. Piezoelectric substrate 2 made of the quartz-based substrate has a cut angle and a propagation direction of the main acoustic wave expressed as an Euler angle ($\phi$, $\theta$, $\psi$) where $-1°\leq\phi\leq1°$, $113°\leq\theta\leq135°$, and $-5°\leq\psi\leq5°$. Piezoelectric substrate 2 made of the lithium tantalite (LiTaO$_3$)-based substrate has a cut angle and a propagation direction of the main acoustic wave expressed as an Euler angle ($\phi$, $\theta$, $\psi$) where $-7.5°\leq\phi\leq2.5°$, $111°\leq\theta\leq121°$, and $-2.5°\leq\psi\leq7.5°$. Angles $\phi$ and $\theta$ represent the cut angle of piezoelectric substrate 2 while angle $\psi$ represents the propagation direction of the main acoustic wave excited by com-shaped electrode 3 formed on piezoelectric substrate 2.

Comb-shaped electrode 3 disposed on piezoelectric substrate 2 and includes a pair of interdigital transducers having comb shapes interdigitating with each other in view from above acoustic wave device 1. Comb-shaped electrode 3 is made of single metal of, e.g. aluminum, copper, silver, gold, titanium, tungsten, molybdenum, platinum, or chrome or an alloy mainly containing one of these metals, or a laminated structure of these metals. In the case that comb-shaped electrode 3 has the laminated structure, for instance, comb-shaped electrode 3 includes a Mo electrode layer mainly made of molybdenum and an Al electrode layer mainly made of aluminum and disposed on the Mo electrode layer in this order from piezoelectric substrate 2. The Mo electrode layer has a higher density and hence confining the main acoustic wave on the surface of acoustic wave device 1 while the Al electrode layer reduces a resistance of comb-shaped electrode 3. The Mo electrode layer may contain additive, such as silicon, while the Al electrode layer may contain additive, such as magnesium, copper, or silicon. These additives increase a withstanding electric power of comb-shaped electrode 3.

The total film thickness of comb-shaped electrode 3 is expressed with the total density "b" of comb-shaped electrode 3 and a density "a" of aluminum and is preferably not smaller than $0.05\lambda \times b/a$ and not larger than $0.15\lambda \times b/a$. This condition allows the main acoustic wave to concentrate on the surface of acoustic wave device 1.

First dielectric film 4 can be made of any medium through which a transverse wave propagates at a lower speed than the Rayleigh wave excited by comb-shaped electrode 3. For instance, first dielectric film 4 is made of medium mainly made of silicon dioxide (SiO$_2$). SiO$_2$ has a temperature coefficient of frequency (TCF) with a sign reverse to that of piezoelectric substrate 2. First dielectric film 4 made of SiO$_2$ improves the temperature coefficient of frequency of acoustic wave device 1.

In the case that first dielectric film 4 is made of silicon oxide, the film thickness of first dielectric film 4 is determined such that an absolute value of the temperature coefficient of frequency of the main acoustic wave excited by comb-shaped electrode 3 is not larger than a predetermined value (40 ppm/° C.). According to this embodiment, the film thickness of first dielectric film 4 is a distance to the upper surface of first dielectric film 4 from an interface between first dielectric film 4 and second dielectric film 5 disposed between the electrode fingers of comb-shaped electrode 3. The thickness of first dielectric film 4 satisfying the predetermined value and made of silicon oxide not smaller than 0.2$\lambda$ and not larger than 0.5$\lambda$.

Second dielectric films 5 and 6 can be made of any medium through which a transverse wave propagates faster than the Rayleigh wave excited by comb-shaped electrode 3. The medium can be mainly made of, for instance, diamond, silicon, silicon nitride, silicon nitride oxide, aluminum nitride, or aluminum oxide.

Figure 2:
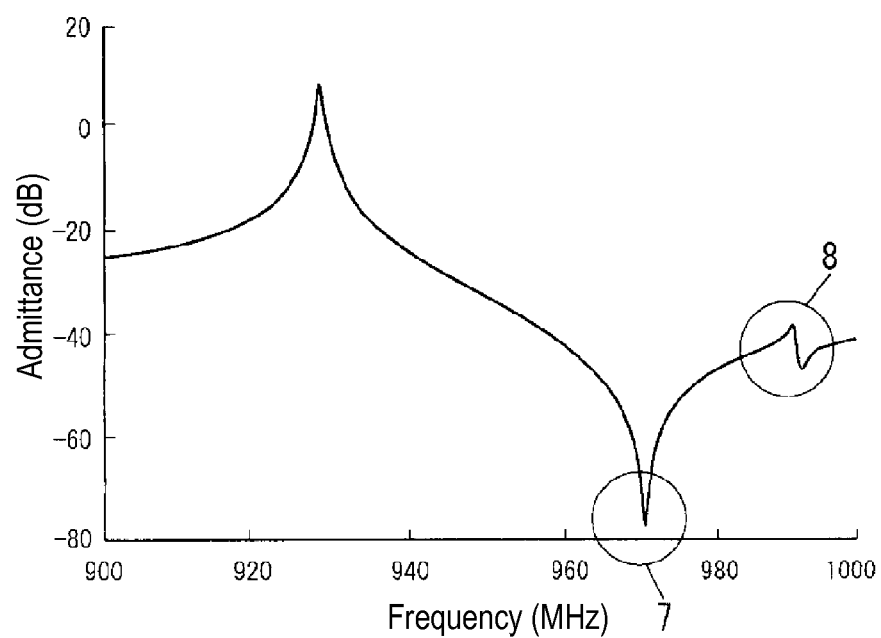
FIG. 2 shows characteristics of the acoustic wave device in accordance with the embodiment.

FIG. 2 shows admittance characteristics (dB) of acoustic wave device 1 including piezoelectric substrate 2, comb-shaped electrode 3, first dielectric film 4, and second dielectric films 5 and 6. Piezoelectric substrate 2 is made of a lithium niobate (LiNbO$_3$)-based substrate having a cut angle and a propagation direction of a Rayleigh wave expressed as an Euler angle ($\phi$, $\theta$, $\psi$) where $-10°\leq\phi\leq10°$, $33°\leq\theta\leq43°$, and $-10°\leq\psi\leq10°$. Comb-shaped electrode 3 includes a molybdenum (Mo) electrode having a film thickness of 0.05$\lambda$ and exciting a Rayleigh wave having a wavelength $\lambda$ of 4000 nm as a main acoustic wave. First dielectric film 4 is made of silicon dioxide (SiO$_2$) having a film thickness of 0.25$\lambda$ measured from an interface between second dielectric film 5 and first dielectric film 4 to an upper surface of film 4. Second dielectric films 5 and 6 are made of silicon nitride (SiN) having a film thickness of 0.045$\lambda$.

As shown in FIG. 2, second dielectric films 5 and 6 moves spurious emission 8 (at a resonance point of the SH wave) produced by the SH wave to a higher frequency than anti-resonance point 7 of the Rayleigh wave.

Figure 3:
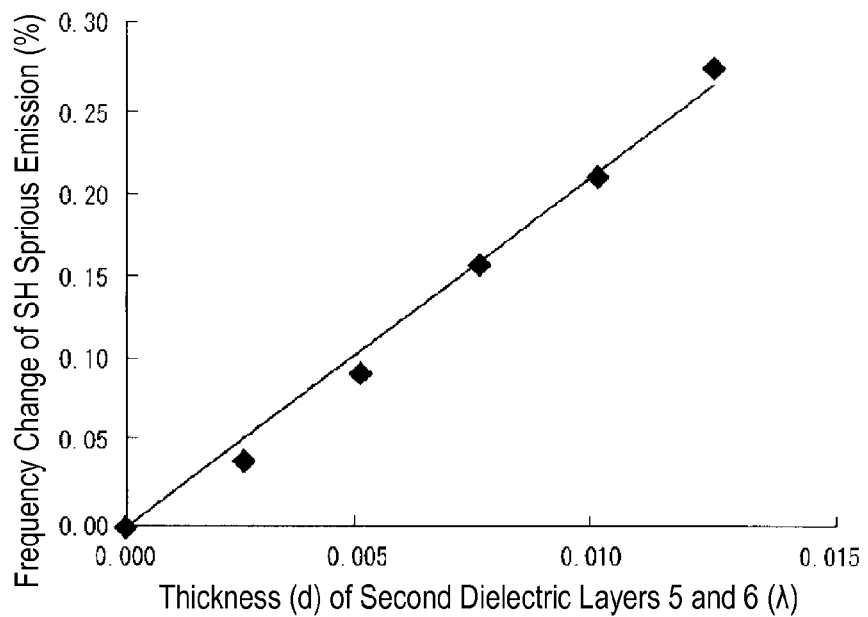
FIG. 3 shows characteristics of the acoustic wave device in accordance with the embodiment.

FIG. 3 shows frequency changes of the spurious emission produced by the SH wave for the film thickness (d) of second dielectric films 5 and 6 changing from 0λ to 0.0125λ. Each frequency change is a percentage calculated by dividing the change by a resonance frequency of the SH wave, and is expressed with reference to film thickness (d) of 0λ of second dielectric films 5 and 6.

As shown in FIGS. 2 and 3, a larger film thickness of second dielectric films 5 and 6 more effectively prevent the frequency of the Rayleigh wave, (i.e. main acoustic wave), from increasing while relatively increasing the frequency of SH wave, the extraneous acoustic wave. The frequency of the Rayleigh wave is prevented from increasing since both of energies of the SH wave and the Rayleigh wave concentrate around an upper surface of piezoelectric substrate 2 while a larger energy of the Rayleigh wave is distributed in first dielectric film 4 than that of the SH wave.

As a result, acoustic wave device 1 upon being used in a filter removes the spurious emission caused by the SH wave from the pass band of the filter, hence improving passing characteristics of the filter.

Figure 4:
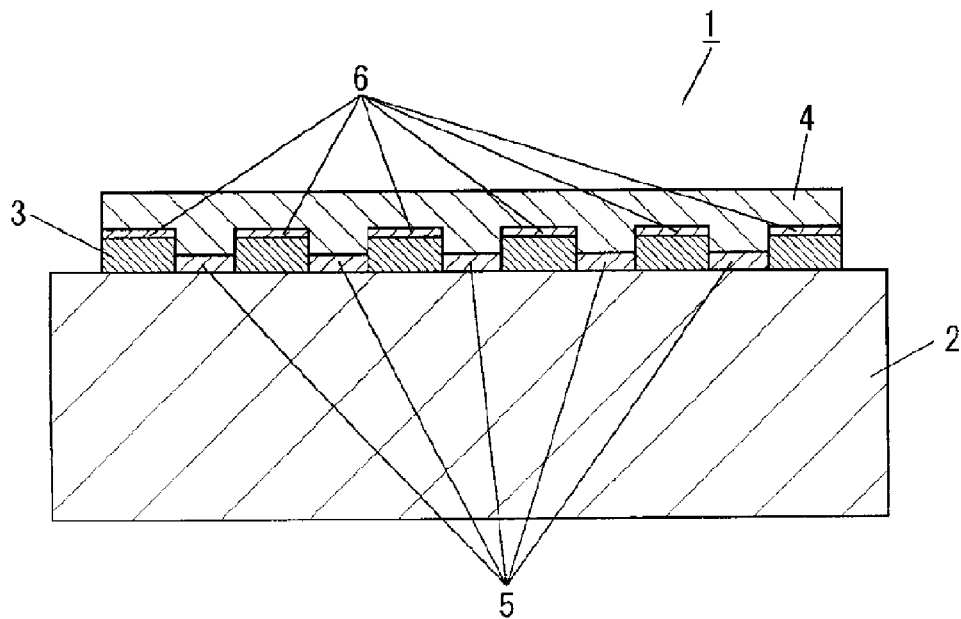
FIG. 4 is a schematic cross-sectional view of another acoustic wave device in accordance with the embodiment.

As shown in FIG. 4, the film thickness of second dielectric film 6 formed above comb-shaped electrode 3 is preferably smaller than that of second dielectric film 5 formed between the electrode fingers of comb-shaped electrode 3.

Figure 5:
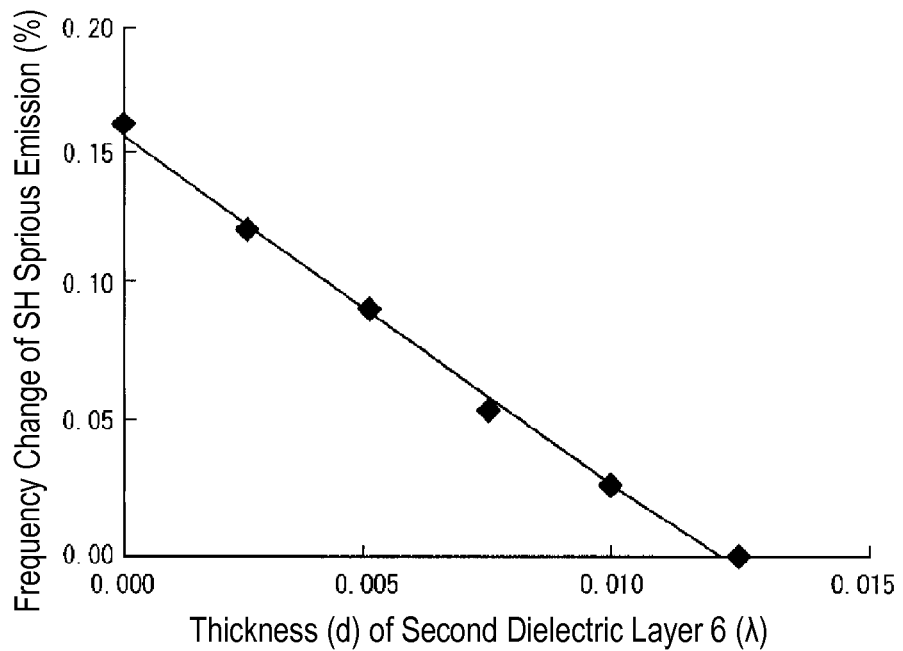
FIG. 5 shows characteristics of the acoustic wave device in accordance with the embodiment.

FIG. 5 shows frequency changes of the spurious emission caused by the SH wave for the film thickness of second dielectric film 6 changing from 0.0125λ to 0λ while the film thickness (d) of second dielectric film 5 is maintained at 0.0125λ. Each frequency change is a percentage calculated by dividing the change by a resonance frequency of the SH wave, and is expressed with reference to film thickness (d) of 0.0125λ of second dielectric film 6. Piezoelectric substrate 2 is made of a lithium niobate (LiNbO$_3$)-based substrate of having a cut angle and a propagation direction of the Rayleigh wave expressed as an Euler angle ($\phi$, $\theta$, $\psi$) where $-10° \leq \phi \leq 10°$, $33° \leq \theta \leq 43°$, and $-10° \leq \psi \leq 10°$. Comb-shaped electrode 3 includes a molybdenum (Mo) electrode layer having a film thickness of 0.05λ and excites the Rayleigh wave having a wavelength λ of 4000 nm as a main acoustic wave. First dielectric film 4 made of silicon dioxide (SiO$_2$) has a film thickness of 0.25λ. Second dielectric films 5 and 6 are made of silicon nitride (SiN).

Figure 6:
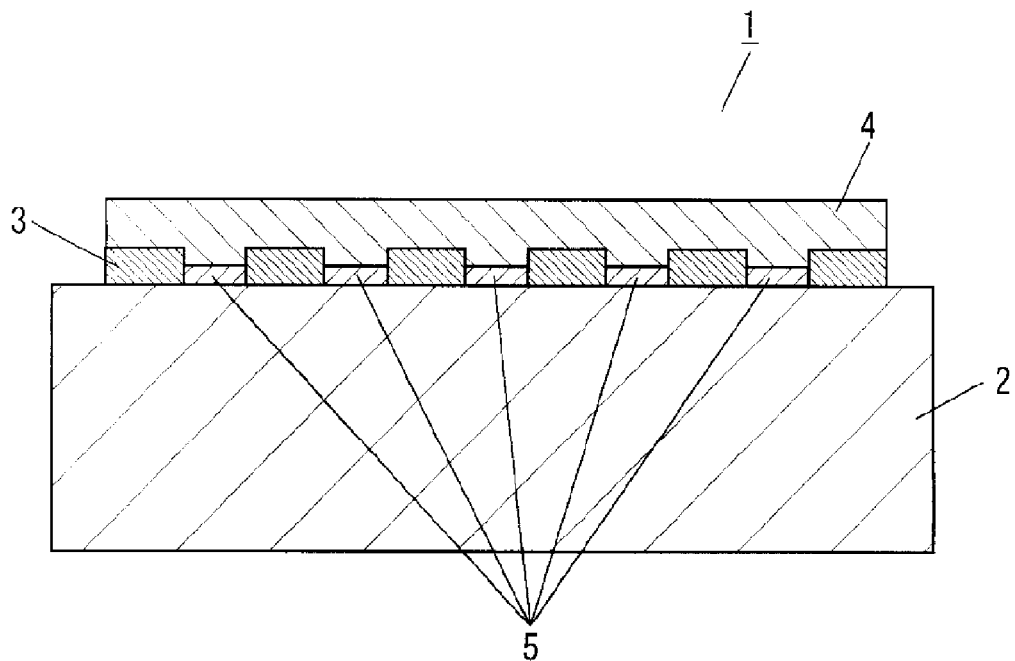
FIG. 6 is a schematic cross-sectional view of still another acoustic wave device in accordance with the embodiment.

The film thickness of 0λ of second dielectric film 6 refers to a structure in which second dielectric film 6 is not formed above comb-shaped electrode 3, namely, the upper surface of comb-shaped electrode 3 directly contacts first dielectric film 4, as shown in FIG. 6. To be more specific, acoustic wave device 1 shown in FIG. 6 includes piezoelectric substrate 2, comb-shaped electrode 3 formed on piezoelectric substrate 2 and exciting a Rayleigh wave as a main acoustic wave, first dielectric film 4 formed above piezoelectric substrate 2 to cover comb-shaped electrode 3, and second dielectric film 5 formed between electric fingers of comb-shaped electrode 3 and between piezoelectric substrate 2 and first dielectric film 4.

As shown in FIG. 5, second dielectric film 6 formed above the comb-shaped electrode and having a smaller film thickness than second dielectric film 5 formed between the electrode fingers of comb-shaped electrode 3 prevents more effectively the frequency of the Rayleigh wave, i.e. the main acoustic wave, from increasing while relatively increasing the frequency of the SH wave, i.e. the extraneous acoustic wave.

The SH wave produces a larger energy around the upper surface of piezoelectric substrate 2 than the Rayleigh wave, accordingly being influenced by the addition of the mass of second dielectric film 6 disposed above comb-shaped electrode 3. Therefore, second dielectric film 6 formed above comb-shaped electrode 3 is thinner than second dielectric film 5 formed between the electrode fingers of comb-shaped electrode 3 to further increases the frequency of the SH wave.

As a result, acoustic wave device 1 upon being used in a filter removes the spurious emission caused by the SH wave from the pass band of the filter, thus improving passing characteristics of the filter.

Figure 7:
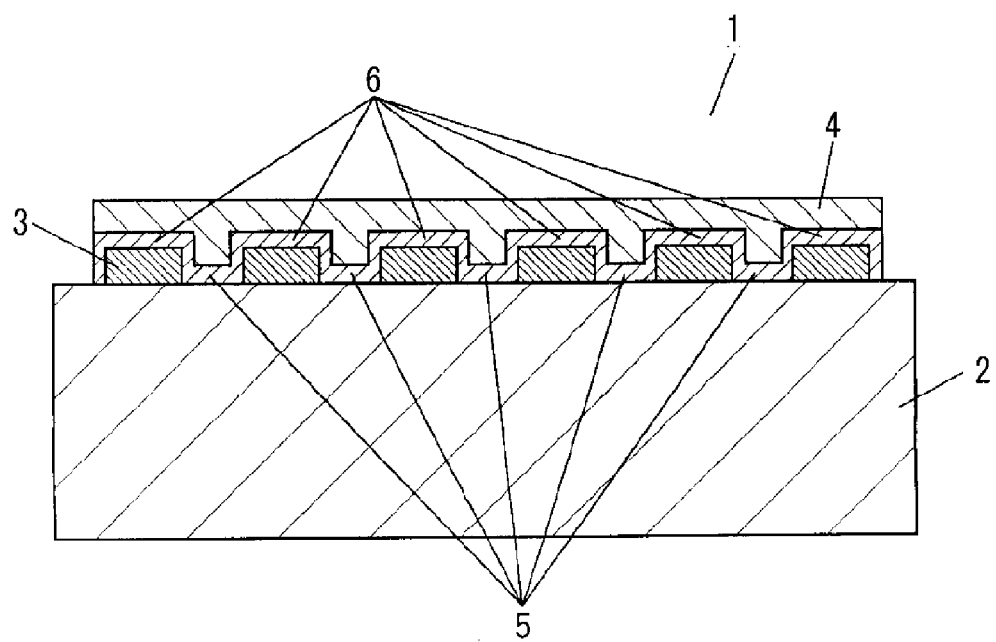
FIG. 7 is a schematic cross-sectional view of a further acoustic wave device in accordance with the embodiment.

As shown in FIG. 7, second dielectric films 5 and 6 may be preferably formed on side surfaces of the electrode fingers of comb-shaped electrode 3. This structure allows dielectric films 5 and 6 to protect comb-shaped electrode 3 more.

In acoustic wave devices 1 shown in FIGS. 1, 4, and 6, the film thickness of second dielectric film 5 formed between the electrode fingers of comb-shaped electrode 3 is smaller than the film thickness of comb-shaped electrode 3. This structure secures an electro-mechanical coupling coefficient.

Figure 8A:
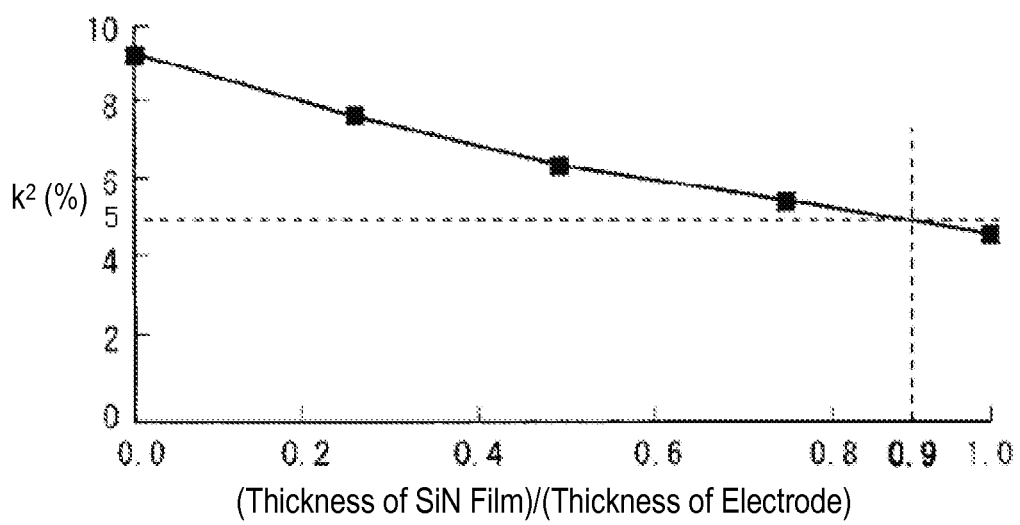
FIG. 8A shows characteristics of the acoustic wave device in accordance with the embodiment.
Figure 8B:
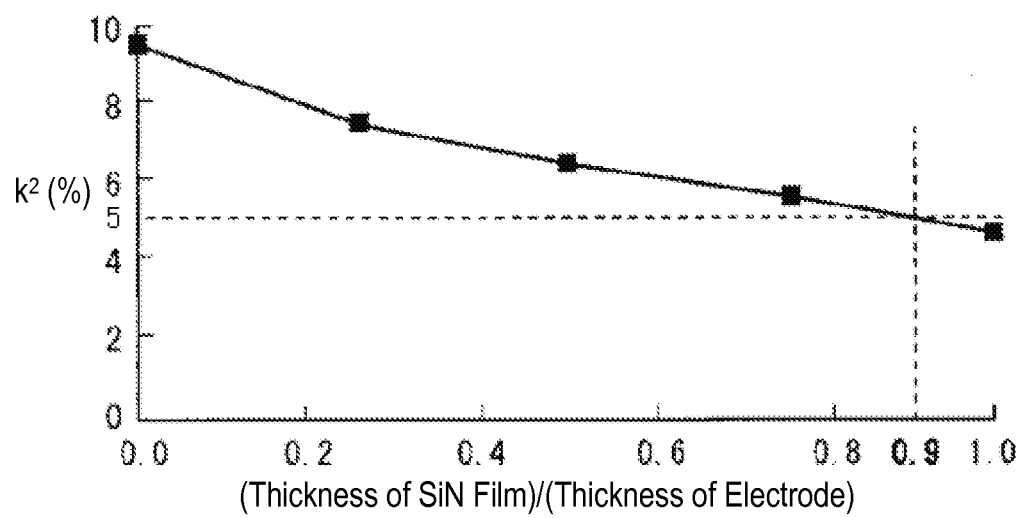
FIG. 8B shows characteristics of the acoustic wave device in accordance with the embodiment.
Figure 8C:
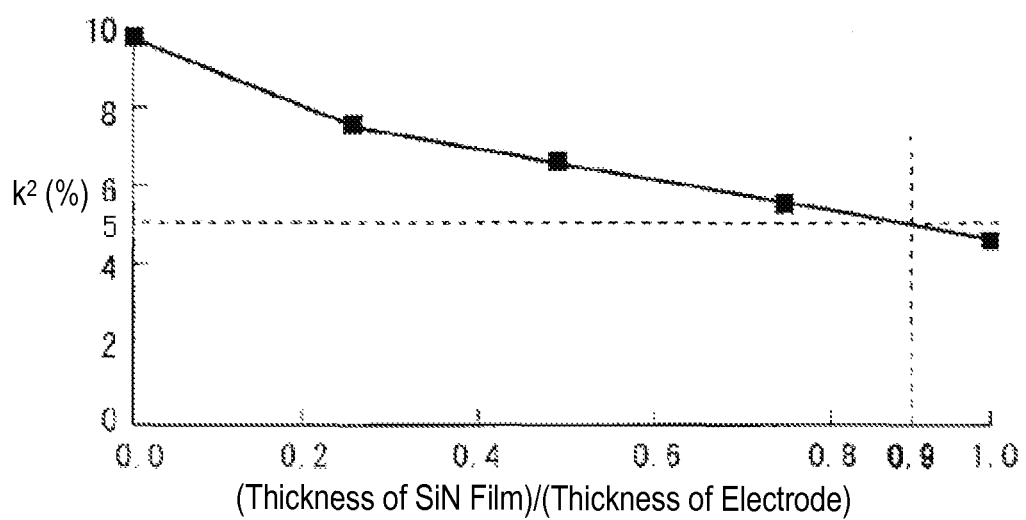
FIG. 8C shows characteristics of the acoustic wave device in accordance with the embodiment.

FIGS. 8A to 8C show the electromagnetic coupling coefficients of acoustic wave device 1 in which the film thickness of second dielectric film 5 (identical to the film thickness of second electric film 6) made of silicon nitride is changed. In acoustic wave device 1, piezoelectric substrate 2 is made of a lithium niobate (LiNbO$_3$)-based substrate. Comb-shaped electrode 3 includes a molybdenum (Mo) electrode layer having a film thickness of 0.05λ and excites a Rayleigh wave having wavelength λ of 4000 nm as a main acoustic wave. First dielectric film 4 is made of silicon oxide having a film thickness of 0.25λ. Second dielectric films 5 and 6 are made of silicon nitride. In FIGS. 8A to 8C, the horizontal axis represents the ratio of the film thickness of second dielectric film 5 to the film thickness of comb-shaped electrode 3, and the vertical axis represents the electromechanical coefficient (%) of acoustic wave device 1. FIG. 8A shows the electromagnetic coupling coefficient of the device in which piezoelectric substrate 2 is made of a lithium niobate-based substrate having a cut angle and a propagation direction of a Rayleigh wave expressed as an Euler angle ($\phi$, $\theta$, $\psi$)=(0°, 36°, 0°). FIG. 8B shows the electromagnetic coupling coefficient of the device in which piezoelectric substrate 2 is made of a lithium niobate-based substrate having a cut angle and a propagation direction of a Rayleigh wave expressed as an Euler angle ($\phi$, $\theta$, $\psi$)=(0°, 38°, 0°). FIG. 8C shows the electromagnetic coupling coefficient of the device in which piezoelectric substrate 2 made of a lithium niobate-based substrate having a cut angle and a propagation direction of the Rayleigh wave expressed as an Euler angle ($\phi$, $\theta$, $\psi$)=(0°, 40°, 0°). As shown in FIGS. 8A to 8C, in the case that piezoelectric substrate 2 is made of a lithium niobate (LiNbO$_3$)-based substrate having a cut angle and a propagation direction of a Rayleigh wave expressed as an Euler angle ($\phi$, $\theta$, $\psi$) where $-10° \leq \phi \leq 10°$, $33° \leq \theta \leq 43°$, and $-10° \leq \psi \leq 10°$, and first dielectric film 4 is made of silicon oxide having a film thickness not smaller than 0.2λ, and not larger than 0.5λ, the film thickness of second dielectric film 5 formed between the electrode fingers of comb-shaped electrode 3 not larger than 0.9 times of the film thickness of comb-shaped electrode 3 allows the electromechanical coupling coefficient k$^2$ of acoustic wave devices 1 to be not smaller than 5%.

Figure 9:
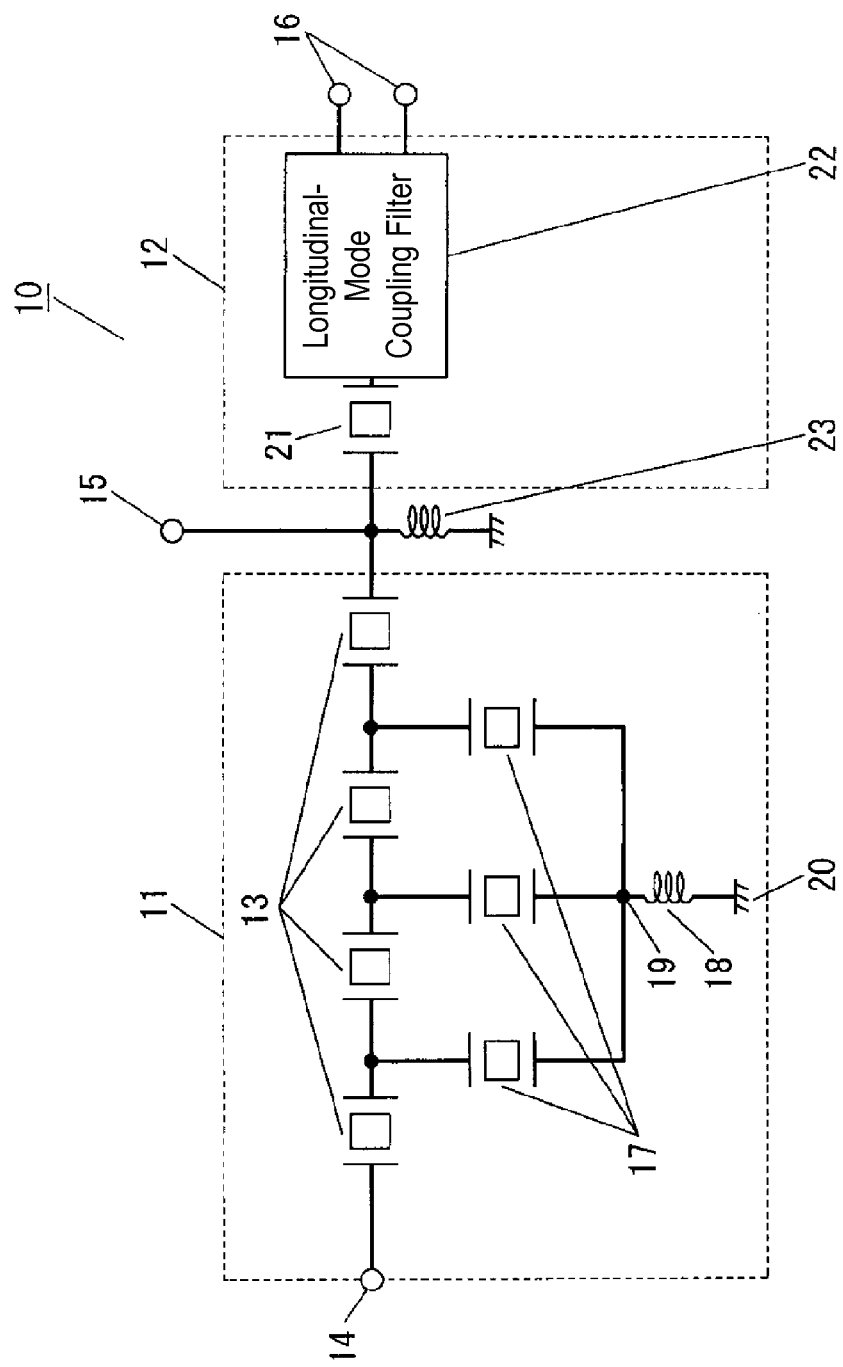
FIG. 9 is a circuit block diagram of an antenna duplexer including the acoustic wave device in accordance with the embodiment.
Figure 10:
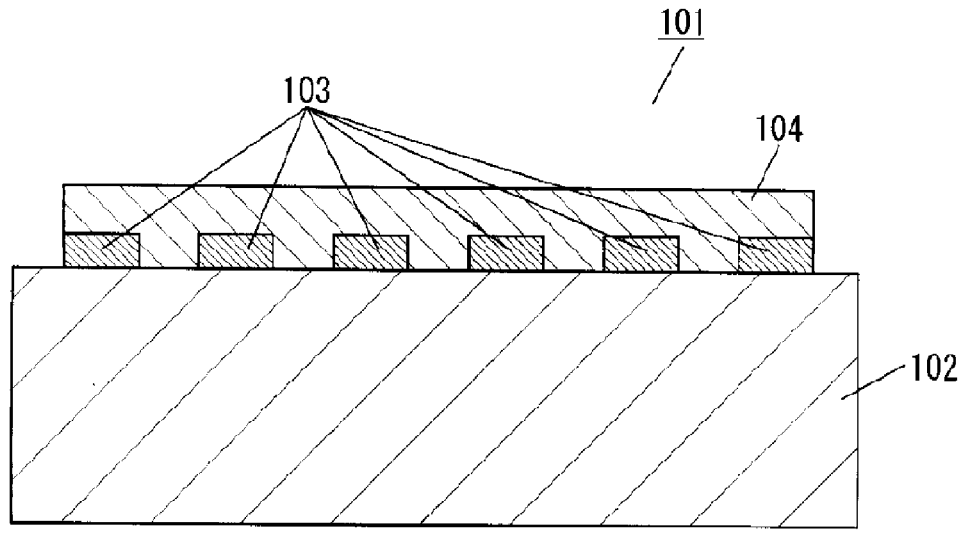
FIG. 10 is a schematic cross-sectional view of a conventional acoustic wave device.
Figure 11:
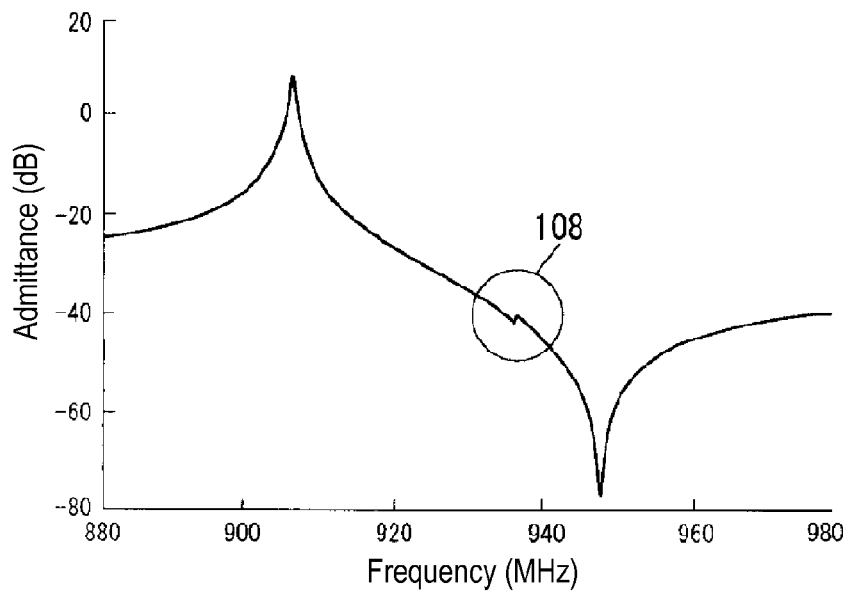
FIG. 11 shows characteristics of the conventional acoustic wave device.

FIG. 9 is a circuit block diagram of antenna duplexer 10 employing acoustic wave device 1 in accordance with the embodiment. As shown in FIG. 9, antenna duplexer 10 includes first filter 11 having a first pass band, and second filter 12 having a second pass band higher than the first pass band.

Antenna duplexer 10 shown in FIG. 9 is used for band 8 of a universal mobile telecommunications system (UMTS) and includes first filter 11 functioning as a transmitting filter and second filter 12 functioning as a receiving filter. First filter 11 has a pass band ranging from 880 MHz to 915 MHz while second filter 12 has a pass band ranging from 925 MHz to 960 MHz. First filter 11 is connected between input terminal 14 and antenna terminal 15, and receives a transmission signal at input terminal 14 and outputs the transmission signal from antenna terminal 15. First filter 11 includes series resonator 13 and parallel resonator 17 connected in a ladder shape. Parallel resonator 17 has a resonance frequency lower than an anti-resonance frequency of series resonator 13. Parallel resonator 17 is connected to ground 20 via ground terminal 19. First filter 11 includes inductor 18 connected between ground terminal 19 and ground 20.

Second filter 12 includes, for instance, resonator 21 and longitudinal-mode coupling filter 22 both connected between antenna terminal 15 and output terminals (balanced terminals) 16. Second filter 12 receives a reception signal at antenna terminal 15 and outputs the reception signal from output terminal 16.

Antenna duplexer 10 includes phase shifter 23 connected between first filter 11 and second filter 12. Phase shifter 23 provides one of the transmitting filter and the receiving filter with high impedance at a pass band of another of the transmitting filter and the receiving filter to improve the isolation between the transmitting filter and the receiving filter.

First filter 11 employs acoustic wave device 1 in accordance with the embodiment. In the case of first filter 11 employing a ladder type acoustic wave filter, in particular, acoustic wave device 1 in accordance with the embodiment at least in series resonator 13 that forms a right wing of the pass band removes the spurious emission caused by the SH wave from the pass band of first filter 11, thus improving the passing characteristics of first filter 11.

INDUSTRIAL APPLICABILITY

An acoustic wave device and an antenna duplexer using the acoustic wave device according to the present invention prevents passing characteristics of a filter employing the acoustic wave device from degrading, and are applicable to electronic apparatuses, such as portable telephones.

REFERENCE NUMERALS

1 Acoustic Wave Device
2 Piezoelectric Substrate
3 Comb-Shaped Electrode
4 First Dielectric Film
5, 6 Second Dielectric Film
7 Anti-Resonance Point
8 Spurious Emission Caused by SH Wave
10 Antenna Duplexer
11 First Filter
12 Second Filter
13 Series Resonator

The invention claimed is:
1. An acoustic wave device comprising:
a piezoelectric substrate;
a comb-shaped electrode disposed on the piezoelectric substrate and configured to excite a Rayleigh wave as a main acoustic wave;
a first dielectric film disposed above the piezoelectric substrate, covering the comb-shaped electrode, and contacting side surfaces of electrode fingers of the comb-shaped electrode, a speed of a transverse wave propagating through the first dielectric film being lower than a speed of the Rayleigh wave excited by the comb-shaped electrode; and
a second dielectric film including a first portion and a second portion, the first portion being disposed between the electrode fingers of the comb-shaped electrode and between the piezoelectric substrate and the first dielectric film, the second portion disposed above the comb-shaped electrode and between the comb-shaped electrode and the first dielectric film, a speed of the transverse wave propagating through the second dielectric film being higher than the speed of the Rayleigh wave exited by the comb-shaped electrode.

2. The acoustic wave device of claim 1 wherein a film thickness of the second portion of the second dielectric film is smaller than a film thickness of the first portion of the second dielectric film.

3. The acoustic wave device of claim 1 wherein a film thickness of the first portion of the second dielectric film is smaller than a film thickness of the comb-shaped electrode.

4. The acoustic wave device of claim 1 wherein a speed of a shear horizontal wave excited by the comb-shaped electrode is higher than the speed of the transverse wave propagating through the first dielectric film, and is lower than the speed of the transverse wave propagating through the second dielectric film.

5. The acoustic wave device of claim 1 wherein the first dielectric film has a temperature coefficient of frequency having a sign reverse to a sign of a temperature coefficient of frequency of the piezoelectric substrate.

6. An antenna duplexer comprising:
a first filter including the acoustic wave device of claim 1 and having a first pass band; and
a second filter having a second pass band higher than the first pass band.

7. An acoustic wave device comprising:
a piezoelectric substrate;
a comb-shaped electrode disposed on the piezoelectric substrate and configured to excite a Rayleigh wave as a main acoustic wave;
a first dielectric film disposed above the piezoelectric substrate, covering the comb-shaped electrode, and contacting side surfaces of electrode fingers of the comb-shaped electrode, a speed of a transverse wave propagating through the first dielectric film being lower than a speed of the Rayleigh wave excited by the comb-shaped electrode; and
a second dielectric film including a first portion disposed between the electrode fingers of the comb-shaped electrode and between the piezoelectric substrate and the first dielectric film, a speed of the transverse wave propagating through the second dielectric film being higher than the speed of the Rayleigh wave exited by the comb-shaped electrode.

8. The acoustic wave device of claim 7 wherein a film thickness of the second dielectric film is smaller than a film thickness of the comb-shaped electrode.

9. The acoustic wave device of claim 7 wherein a speed of a shear horizontal wave excited by the comb-shaped electrode is higher than the speed of the transverse wave propagating through the first dielectric film, and is lower than the speed of the transverse wave propagating through the second dielectric film.

10. The acoustic wave device of claim 7 wherein the second dielectric film contacts the side surfaces of the electrode fingers of the comb-shaped electrode.

11. The acoustic wave device of claim 7 wherein the first dielectric film has a temperature coefficient of frequency having a sign reverse to a sign of a temperature coefficient of frequency of the piezoelectric substrate.

12. An antenna duplexer comprising:
a first filter including the acoustic wave device of claim 7 and having a first pass band; and
a second filter having a second pass band higher than the first pass band.

13. The acoustic wave device of claim 7 wherein the second dielectric film includes a second portion disposed on upper surfaces of the electrode fingers of the comb-shaped electrode.

14. The acoustic wave device of claim 13 wherein the second portion of the second dielectric film is thinner than the first portion of the second dielectric film.

15. The acoustic wave device of claim 7 wherein the first dielectric film contacts upper surfaces of the electrode fingers of the comb-shaped electrode.

16. An acoustic wave device comprising:
a piezoelectric substrate;
a comb-shaped electrode disposed on the piezoelectric substrate and configured to excite a Rayleigh wave having a wavelength $\lambda$ as a main acoustic wave;
a first dielectric film disposed above the piezoelectric substrate and covering the comb-shaped electrode, a speed of a transverse wave propagating through the first dielectric film being lower than a speed of the Rayleigh wave excited by the comb-shaped electrode; and
a second dielectric film including a first portion and a second portion, the first portion being disposed between the electrode fingers of the comb-shaped electrode and between the piezoelectric substrate and the first dielectric film, the second portion disposed above the comb-shaped electrode and between the comb-shaped electrode and the first dielectric film, a speed of the transverse wave propagating through the second dielectric film being higher than the speed of the Rayleigh wave exited by the comb-shaped electrode, a film thickness of the first portion of the second dielectric film being greater than a film thickness of the second portion of the second dielectric film and smaller than a thickness of the comb-shaped electrode.

17. The acoustic wave device of claim 16 wherein the first dielectric film has a thickness of between $0.2\lambda$ and $0.5\lambda$.

18. The acoustic wave device of claim 17 wherein the first dielectric film includes silicon dioxide.

19. The acoustic wave device of claim 16 wherein the film thickness of the first portion of the second dielectric film is less than 0.9 times the thickness of the comb-shaped electrode.

20. The acoustic wave device of claim 16 wherein the first portion of the second dielectric film contacts the side surfaces of the electrode fingers of the comb-shaped electrode.

\* \* \* \* \*